(12) United States Patent
Lee et al.

(10) Patent No.: US 12,406,882 B2
(45) Date of Patent: Sep. 2, 2025

(54) SEMICONDUCTOR ELEMENT AND METHOD FOR MANUFACTURING THE SAME

(71) Applicant: MACRONIX INTERNATIONAL CO., LTD., Hsinchu (TW)

(72) Inventors: Dai-Ying Lee, Hsinchu County (TW); Yu-Chao Huang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 522 days.

(21) Appl. No.: 17/821,479

(22) Filed: Aug. 23, 2022

(65) Prior Publication Data

US 2024/0071821 A1  Feb. 29, 2024

(51) Int. Cl.
*H01L 21/768* (2006.01)
*H01L 23/522* (2006.01)
*H01L 23/532* (2006.01)

(52) U.S. Cl.
CPC .. *H01L 21/76843* (2013.01); *H01L 21/76877* (2013.01); *H01L 23/5226* (2013.01); *H01L 23/53266* (2013.01)

(58) Field of Classification Search
CPC ......... H01L 21/76843; H01L 21/76877; H01L 23/5226; H01L 23/53266
USPC ........................................................ 257/751
See application file for complete search history.

(56) References Cited

U.S. PATENT DOCUMENTS

| | | |
|---|---|---|
| 10,510,641 B2 | 12/2019 | Lin et al. |
| 2007/0241319 A1 | 10/2007 | Chang |
| 2008/0217775 A1 | 9/2008 | Pai et al. |
| 2013/0119547 A1* | 5/2013 | Kim .................. H01L 21/76898 257/774 |
| 2013/0328202 A1 | 12/2013 | Huang et al. |
| 2018/0158728 A1 | 6/2018 | Chu et al. |

FOREIGN PATENT DOCUMENTS

| | | |
|---|---|---|
| TW | 410456 B | 11/2000 |
| TW | 201505140 A | 2/2015 |
| TW | 201519298 A | 5/2015 |

* cited by examiner

*Primary Examiner* — Tu-Tu V Ho
(74) *Attorney, Agent, or Firm* — McClure, Qualey & Rodack, LLP

(57) ABSTRACT

A semiconductor element and a method for manufacturing the same are provided. The semiconductor element includes a plug and a via on the plug and electrically connected to the plug. The plug includes a tungsten plug and a conductive layer on the tungsten plug. The tungsten plug and the conductive layer include different materials. The tungsten plug has a first width in a lateral direction. The conductive layer has a second width in the lateral direction. The second width is greater than or equal to the first width. The conductive layer is between the via and the tungsten plug.

20 Claims, 9 Drawing Sheets

SEMICONDUCTOR ELEMENT AND METHOD FOR MANUFACTURING THE SAME

BACKGROUND

Technical Field

The present disclosure relates to a semiconductor element and method for manufacturing the same.

Description of the Related Art

As the size of semiconductor devices shrinks and the integration increases, it becomes increasingly difficult to control the profiles of elements in the semiconductor device, which may affect the electrical performance of the semiconductor device. For example, the profile defects of elements may cause elements not to be formed in the expected positions, resulting in problems such as open circuits and short circuits.

It is important to provide technology for semiconductor elements with improved electrical performance.

SUMMARY

The present disclosure relates to a semiconductor element and a method for manufacturing the same.

According to an embodiment of the present disclosure, a semiconductor element is provided. The semiconductor element includes a plug and a via on the plug and electrically connected to the plug. The plug includes a tungsten plug and a conductive layer on the tungsten plug. The tungsten plug and the conductive layer include different materials. The tungsten plug has a first width in a lateral direction. The conductive layer has a second width in the lateral direction. The second width is greater than or equal to the first width. The conductive layer is between the via and the tungsten plug.

According to another embodiment of the present disclosure, a method for manufacturing the semiconductor element is provided. The method includes the following steps. Forming an opening in a dielectric layer. Forming a tungsten plug in the opening. Forming a conductive layer on the tungsten plug, wherein the conductive layer is in the opening. Forming a via on the conductive layer, wherein the via is electrically connected to the conductive layer and the tungsten plug, the tungsten plug and the conductive layer comprises different materials.

The above and other embodiments of the disclosure will become better understood with regard to the following detailed description of the non-limiting embodiment(s). The following description is made with reference to the accompanying drawings.

DETAILED DESCRIPTION

Figure 1:
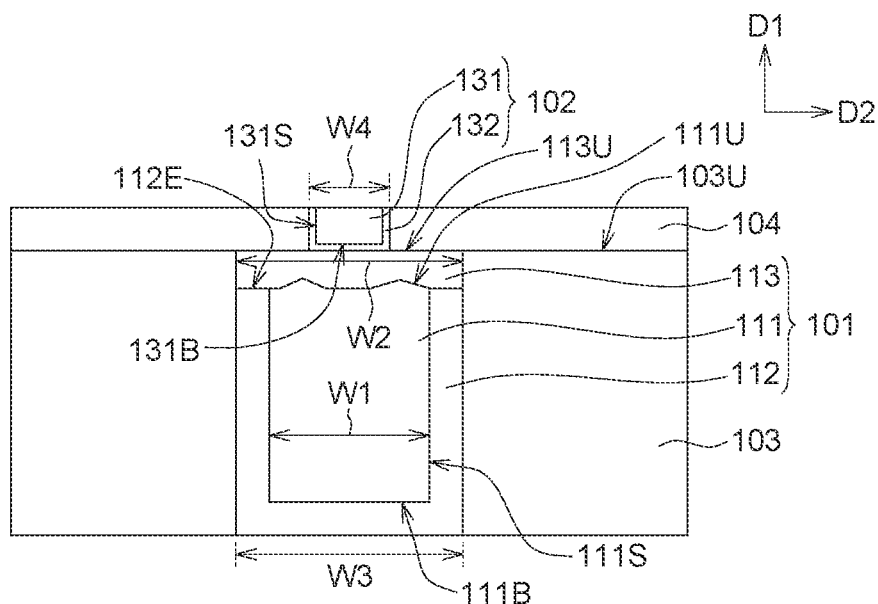
FIG. 1 illustrates a cross-sectional view of a semiconductor element according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

Referring to FIG. 1. FIG. 1 illustrates a cross-sectional view of a semiconductor element 10 according to an embodiment of the present disclosure. The semiconductor element 10 includes a plug 101, a via 102 electrically connected to the plug 101, a dielectric layer 103 and a dielectric film 104. The plug 101 may be in the dielectric layer 103. The plug 101 includes a tungsten plug 111, a barrier layer 112 and a conductive layer 113. The barrier layer 112 may be on a sidewall 111S and a lower surface 111B of the tungsten plug 111. Part of the barrier layer 112 may be between the tungsten plug 111 and the dielectric layer 103. In an embodiment, the barrier layer 112 directly contacts the dielectric layer 103 and/or the tungsten plug 111. The conductive layer 113 is between the via 102 and the tungsten plug 111, The conductive layer 103 is on an upper surface 111U of the tungsten plug 111. In an embodiment, the conductive layer 113 covers the upper surface 111U of the tungsten plug 111 and an end portion 112E of the barrier layer 112. In an embodiment, the conductive layer 113 directly contacts the tungsten plug 111 and the barrier layer 112. The tungsten plug 111 and the conductive layer 113 may include different materials.

In an embodiment, an upper surface 113U of the conductive layer 113 and an upper surface 103U of the dielectric layer 103 may be coplanar. In other embodiments, the upper surface 113U of the conductive layer 113 is lower than or higher than the upper surface 103U of the dielectric layer 103 in a longitudinal direction D1. For example, in the embodiment in which the upper surface 113U of the conductive layer 113 is higher than the upper surface 103U of the dielectric layer 103 in the longitudinal direction D1, the absolute value of the height difference between the upper surface 113U of the conductive layer 113 and the upper surface 103U of the dielectric layer 103 may be greater than 0 and less than or equal to 300 Angstroms (Å). For example, in the embodiment in which the upper surface 113U of the conductive layer 113 is lower than the upper surface 103U of the dielectric layer 103 in the longitudinal direction D1, the absolute value of the height difference between the upper surface 113U of the conductive layer 113 and the upper surface 103U of the dielectric layer 103 may be greater than 0 and less than 300 Angstroms (Å). The upper surface 111U of the tungsten plug 111 may be lower than the upper surface 103U of the dielectric layer 103. A roughness of the upper surface 113U of the conductive layer 113 may be less than a roughness of the upper surface 111U of the tungsten plug 111.

The via 102 may be in the dielectric film 104. The via 102 is on the plug 101. The plug 101 and the via 102 may overlap with each other in the longitudinal direction D1. The via 102 includes a conductive via 131 and a barrier film 132. The barrier film 132 may be on a sidewall 131S and a lower surface 131B of the conductive via 131. Part of the barrier film 132 may be between the conductive via 131 and the dielectric film 104. Another part of the barrier film 132 may be between the conductive layer 113 and the conductive via 131. In an embodiment, the barrier film 132 directly contacts the dielectric film 104 and/or the conductive via 131. In an embodiment, the barrier film 132 directly contacts the conductive layer 113. The conductive via 131 of the via 102, the barrier film 132 of the via 102, the conductive layer 113 of the plug 101, the tungsten plug 111 of the plug 101 and the barrier layer 112 of the plug 101 are electrically connected to each other.

The tungsten plug 111 has a first width W1 in a lateral direction D2. The conductive layer 113 has a second width W2 in the lateral direction D2. The second width W2 of the conductive layer 113 may be greater than or equal to the first width W1 of the tungsten plug 111. In an embodiment in which the second width W2 of the conductive layer 113 is equal to the first width W1 of the tungsten plug 111 (not shown), the barrier layer 112 may extend upward to the dielectric film 104. The plug 101 has a third width W3 in a lateral direction D2. The via 102 has a via width W4 in a lateral direction D2. The third width W3 of the plug 101 may be greater than the via width W4 of the via 102. For example, the third width W3 of the plug 101 is greater than two times of the via width W4 of the via 102

$$\left(\frac{W3}{W4} > 2\right).$$

The longitudinal direction D1 may be substantially perpendicular to the lateral direction D2. In an embodiment, the third width W3 of the plug 101 is between 100 nm (nanometer) and 500 nm. For example, the third width W3 of the plug 101 is about 300 nm. In an embodiment, the via width W4 of the via 102 is between 50 nm and 250 nm. For example, the via width W4 of the via 102 is about 100 nm.

Figure 2:
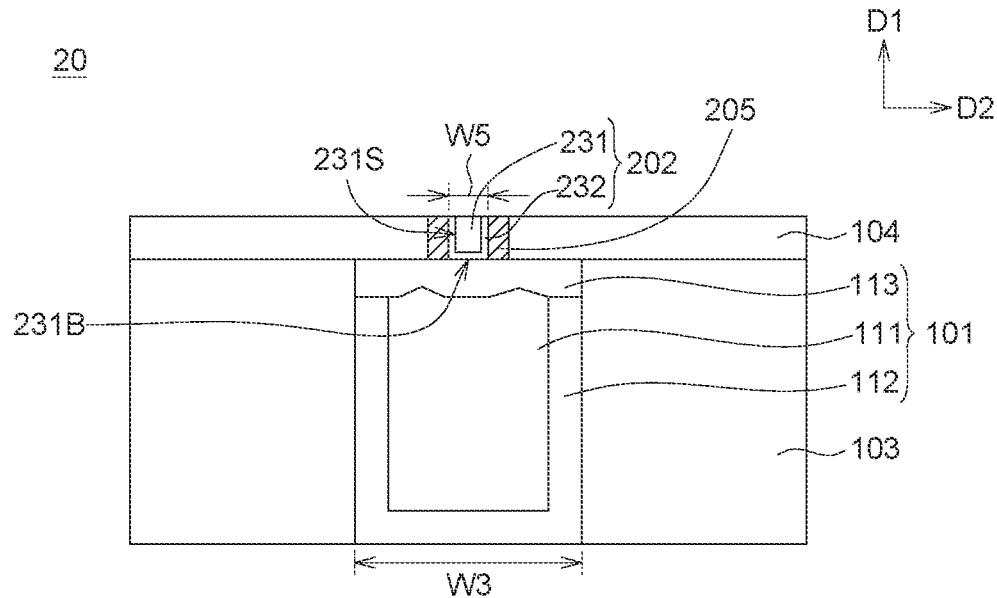
FIG. 2 illustrates a cross-sectional view of a semiconductor element according to another embodiment of the present disclosure.

Referring to FIG. 2. FIG. 2 illustrates a cross-sectional view of a semiconductor element 20 according to another embodiment of the present disclosure. The semiconductor element 20 is different from the semiconductor element 10 with the following description. The semiconductor element 20 further includes an isolation film 205 between the dielectric film 104 and the via 202.

The via 202 may be in the dielectric film 104. The via 202 is on the plug 101. The plug 101 and the via 202 may overlap with each other in the longitudinal direction D1. The via 202 includes a conductive via 231 and a barrier film 232. The barrier film 232 may be on a sidewall 231S and a lower surface 231B of the conductive via 231. Part of the barrier film 232 may be between the conductive via 231 and the dielectric film 104 and between the conductive via 231 and the isolation film 205. Another part of the barrier film 232 may be between the conductive layer 113 and the conductive via 231. In an embodiment, the barrier film 232 directly contacts the isolation film 205 and/or the conductive via 231. In an embodiment, the barrier film 232 directly contacts the conductive layer 113. The conductive via 231 of the via 202, the barrier film 232 of the via 202, the conductive layer 113 of the plug 101, the tungsten plug 111 of the plug 101 and the barrier layer 112 of the plug 101 are electrically connected to each other.

In this embodiment, the via 202 has a via width W5 in a lateral direction D2. The third width W3 of the plug 101 may be greater than the via width W5 of the via 202. For example, the third width W3 of the plug 101 is greater than three times of the via width W5 of the via 102 (W3/W5>3). In an embodiment, the via width W5 of the via 202 is between 5 nm and 90 nm. For example, the via width W5 of the via 202 is about 25 nm.

FIGS. 3-10 schematically illustrate a method for manufacturing a semiconductor element according to an embodiment of the present disclosure.

Figure 3:
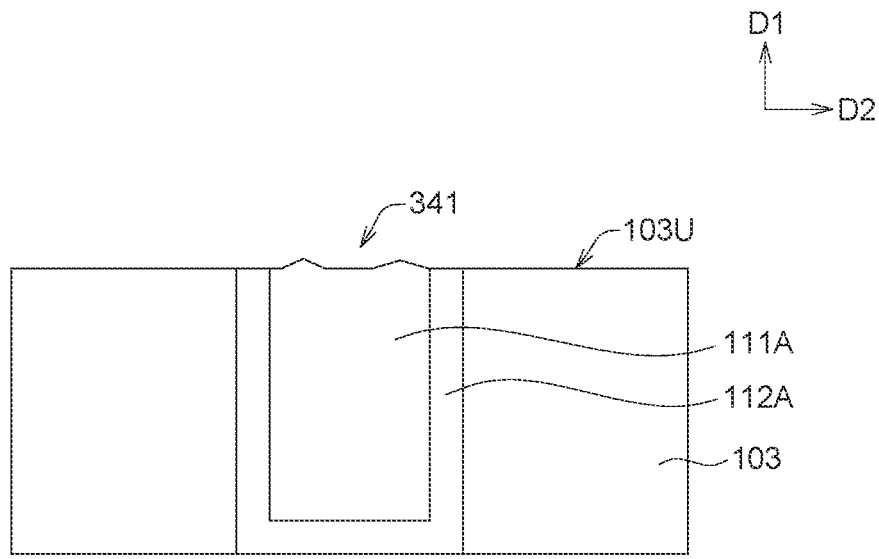
FIGS. 3-10 schematically illustrate a method for manufacturing a semiconductor element according to an embodiment of the present disclosure.

Referring to FIG. 3. A dielectric layer 103 is provided. The dielectric layer 103 may include a dielectric material such as silicon dioxide ($SiO_2$), silicon nitride (SiN), silicon oxynitride (SiON), aluminum oxide ($Al_2O_3$), etc. An opening 341 is formed in the dielectric layer 103. A barrier layer 112A is formed in the opening 341. A tungsten plug 111A is formed in the opening 341. The tungsten plug 111A is formed on the barrier layer 112A. In an embodiment, the opening 341 may be formed by applying an etching process, such as a wet etching process or a dry etching process, to remove a portion of the dielectric layer 103. The opening 341 exposes a sidewall of the dielectric layer 103. The barrier layer 112A may be formed on an upper surface 103U of the dielectric layer 103 and lining the opening 341 by a deposition process such as a chemical vapor deposition (CVD) process. A plug material layer may be formed on the barrier layer 112A by a deposition process such as a chemical vapor deposition process. Then, portions of the barrier layer 112A and the plug material layer on the upper surface 103U of the dielectric layer 103 are removed by a chemical-mechanical planarization (CMP) process or other suitable etching processes, and portions of the barrier layer 112A and the plug material layer in the opening 341 are remained. By which, the structure shown in FIG. 3 is formed. The portion of the plug material layer in the opening 341 is the tungsten plug 111A.

Figure 4:
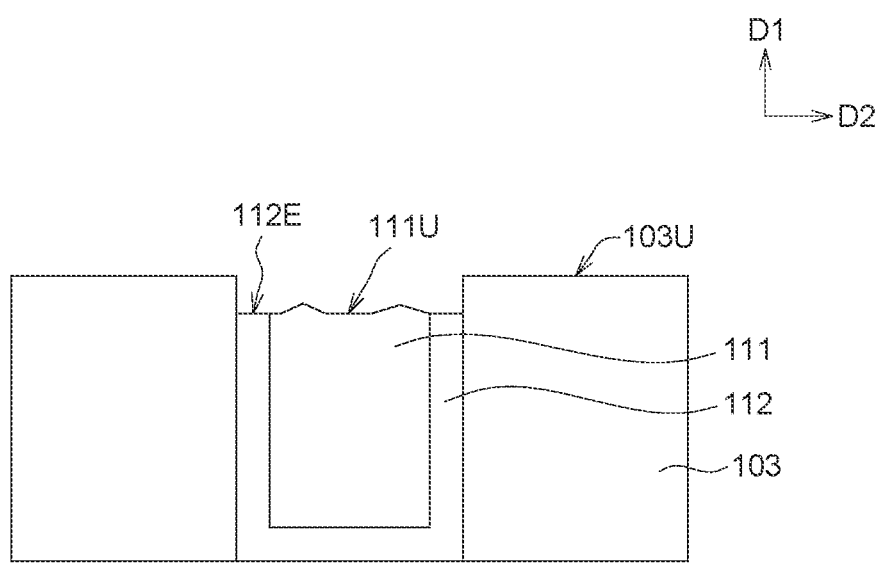

Referring to FIG. 4. Portions of the tungsten plug 111A and the barrier layer 112A are removed to form a tungsten plug 111 and a barrier layer 112 respectively. An upper surface 111U of the tungsten plug 111 and an end portion 112E of the barrier layer 112 may be lower than the upper surface 103U of the dielectric layer 103 in the longitudinal direction D1. The plug material layer, the tungsten plug 111A and the tungsten plug 111 may include tungsten. The barrier layer 112A and the barrier layer 112 may include metal barrier materials such as titanium nitride (TiN), tantalum (Ta), cobalt (Co), titanium (Ti), tantalum nitride (TaN), silicon (Si), manganese (Mn), hafnium (Hf), etc. In an embodiment, portions of the tungsten plug 111A and the barrier layer 112A may be removed by a chemical-mechanical planarization process or other suitable etching processes. In another embodiment (not shown), a portion of the tungsten plug 111A may be removed to form the tungsten plug 111, and the barrier layer 112A is remained; the upper surface 111U of the tungsten plug 111 is lower than the upper surface 103U of the dielectric layer 103 in the longitudinal direction D1, and the barrier layer maintain the structure shown in FIG. 3.

In the longitudinal direction D1, the absolute value of the height difference between the upper surface 111U of the tungsten plug 111 and the upper surface 103U of the dielectric layer 103 may be between 300 Angstroms (Å) and 2000 Angstroms (Å). In the longitudinal direction D1, the absolute value of the height difference between the end portion 112E of the barrier layer 112 and the upper surface 103U of the dielectric layer 103 may be between 0 Angstroms (Å) and 2000 Angstroms (Å).

Figure 5:
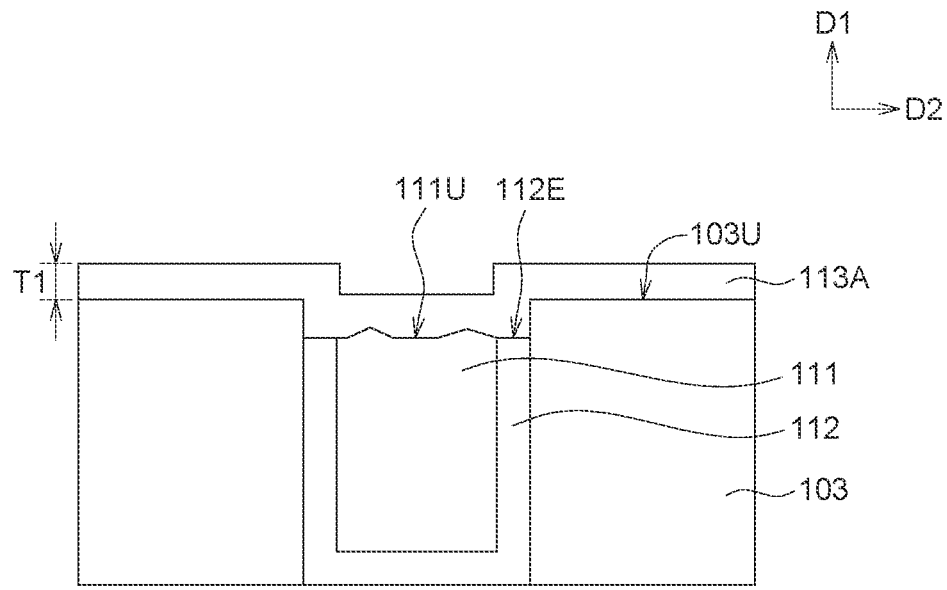
Figure 6:
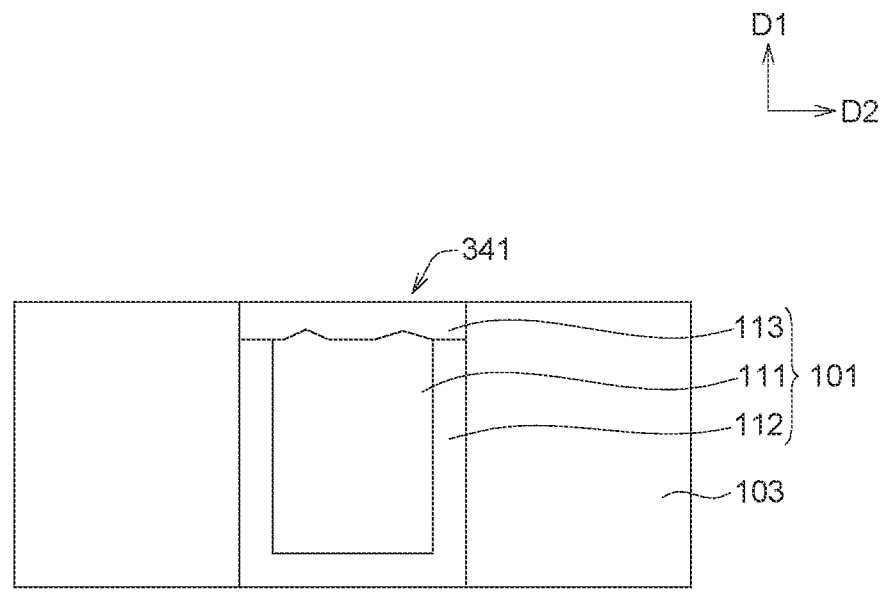

Referring to FIGS. 5-6. A conductive layer 113A is formed on the tungsten plug 111 and the dielectric layer 103.

A portion of the conductive layer 113A on the upper surface 103U of the dielectric layer 103 is removed and a conductive layer 113 shown in FIG. 6 is formed. A plug 101 is formed. The conductive layer 113 may be in the opening 341. The conductive layer 113A and the conductive layer 113 may include conductive materials such as titanium nitride (TiN), titanium (Ti), tantalum (Ta), tantalum nitride (TaN), etc. The conductive layer 113A/113 may directly contact the dielectric layer 103. In an embodiment, the conductive layer 113A may be formed on the upper surface 111U of the tungsten plug 111, the end portion 112E of the barrier layer 112, and the upper surface 103U of the dielectric layer 103 by a deposition process such as a chemical vapor deposition process. A portion of the conductive layer 113A on the upper surface 103U of the dielectric layer 103 may be removed by a chemical-mechanical planarization process or other suitable etching processes. The conductive layer 113A shown in FIG. 5 has a thickness T1 in the longitudinal direction D1. The thickness T1 of the conductive layer 113A may be between 400 Angstroms (Å) and 2100 Angstroms (Å). For example, the thickness T1 of the conductive layer 113A in the longitudinal direction D1 may be about 800 Angstroms (Å).

Figure 7:
Figure 7:
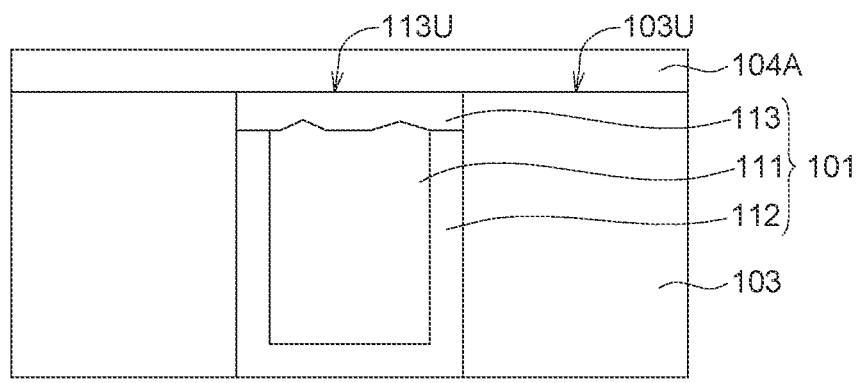
Figure 8:
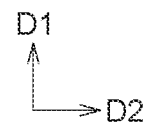
Figure 8:
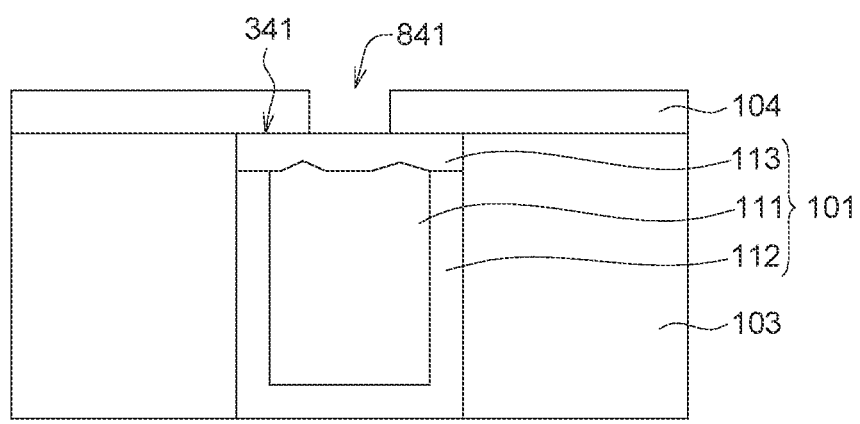

Referring to FIGS. 7-8. A dielectric film 104A is formed on the conductive layer 113 and the dielectric layer 103. A portion of the dielectric film 104A is removed to form a dielectric film 104 and a hole 841 in the dielectric film 104, as shown in FIG. 8. The bottom of the hole 841 exposes the conductive layer 113. The hole 841 may be smaller than the opening 341. The dielectric film 104A and the dielectric film 104 may include dielectric materials such as silicon dioxide (SiO$_2$), silicon nitride (SiN), silicon oxynitride (SiON), aluminum oxide (Al$_2$O$_3$), etc. In an embodiment, the dielectric film 104A may be formed on an upper surface 113U of the conductive layer 113 and the upper surface 103U of the dielectric layer 103 by a deposition process such as a chemical vapor deposition process. The hole 841 may be formed in the dielectric film 104A by an etching process such as a wet etching process or a dry etching process. The portion of the dielectric film 104A remained in this step is the dielectric film 104. The dielectric film 104A/104 may have a thickness between 200 Angstroms (Å) and 2000 Angstroms (Å) in the longitudinal direction D1. For example, the thickness of the dielectric film 104A/104 in the longitudinal direction D1 may be about 1000 Angstroms (Å).

Figure 9:
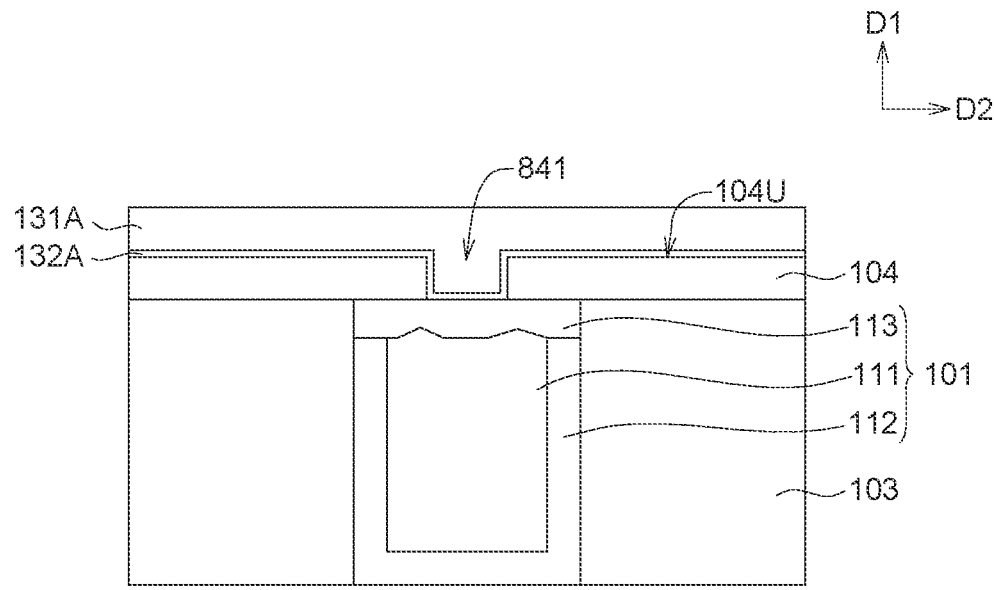
Figure 10:
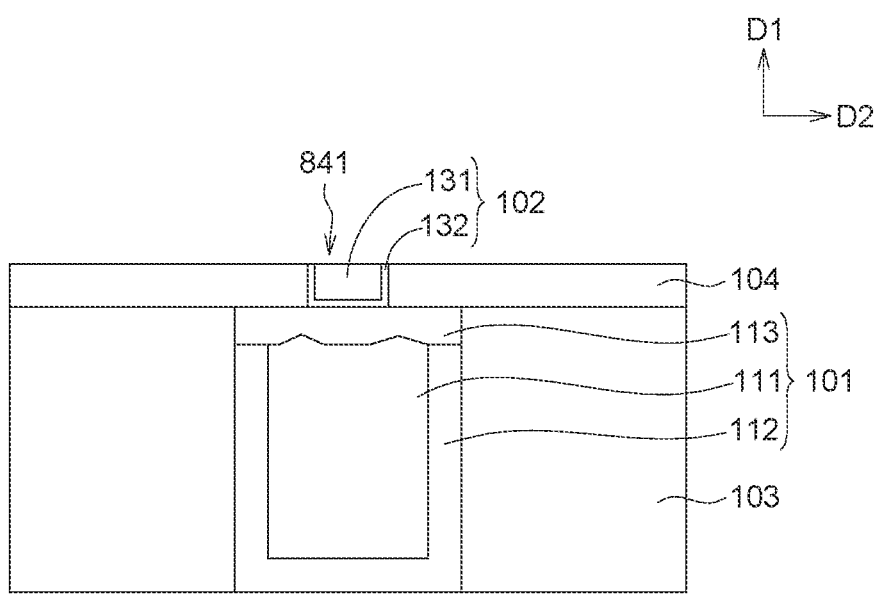

Referring to FIGS. 9-10. A barrier film 132A is formed on the dielectric film 104 and in the hole 841. A via material film 131A is formed on the barrier film 132A and in the hole 841. Portions of the barrier film 132A and the via material film 131A on an upper surface 104U of the dielectric film 104 are removed and portions of the barrier film 132A and the via material film 131A in the hole 841 are remained to form a barrier film 132 and a conductive via 131 shown in FIG. 10. By which, the via 102 is formed. The portion of the via material film 131A in the hole 841 is the conductive via 131. The via material film 131A and the conductive via 131 may include conductive materials such as titanium nitride (TiN), titanium (Ti), tantalum (Ta), tantalum nitride (TaN), tungsten (W), silicon (Si), Copper (Cu), Hafnium (Hf), etc. The barrier film 132A and the barrier film 132 may include metal barrier materials such as titanium nitride (TiN), tantalum (Ta), cobalt (Co), titanium (Ti), tantalum nitride (TaN), silicon (Si), manganese (Mn), hafnium (Hf), etc. In an embodiment, the barrier film 132A may be formed on the upper surface 104U of the dielectric film 104 and lining the hole 841 by a deposition process such as a chemical vapor deposition process. The via material film 131A may fill the remaining space of the hole 841 and be disposed on the barrier film 132A by a deposition process such as a chemical vapor deposition process. Portions of the barrier film 132A and the via material film 131A on the upper surface 104U of the dielectric film 104 may be removed to form the via 102 by a chemical-mechanical planarization process or other suitable etching processes.

In an embodiment, a semiconductor element 10 shown in FIG. 1 may be provided through the method schematically illustrated in FIGS. 3-10.

FIGS. 11-16 schematically illustrate a method for manufacturing a semiconductor element according to another embodiment of the present disclosure. In an embodiment, the manufacturing steps illustrated with referring to FIGS. 11-16 may be performed after the manufacturing steps illustrated with referring to FIGS. 3-8.

Figure 11:
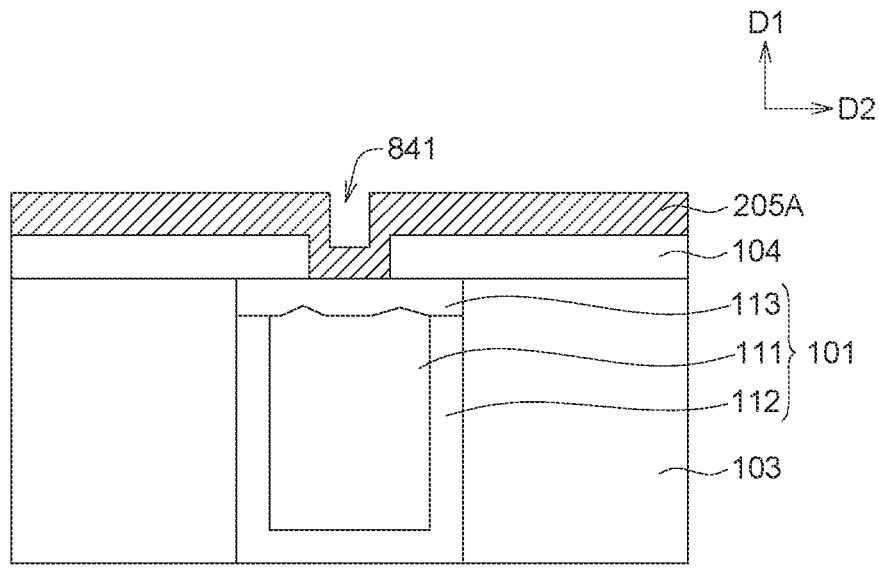
FIGS. 11-16 schematically illustrate a method for manufacturing a semiconductor element according to an embodiment of the present disclosure.

Referring to FIG. 11. An isolation material film 205A is formed on the dielectric film 104 and in the hole 841. For example, the isolation material film 205A may be formed by a deposition process such as a chemical vapor deposition process. The isolation material film 205A may include a dielectric material such as silicon dioxide (SiO$_2$), silicon nitride (SiN), silicon oxynitride (SiON), aluminum oxide (Al$_2$O$_3$), etc. The isolation material film 205A may have a thickness between 500 Angstroms (Å) and 2500 Angstroms (Å) in the longitudinal direction D1. For example, the thickness of the isolation material film 205A in the longitudinal direction D1 may be about 1000 Angstroms (Å).

Figure 12:
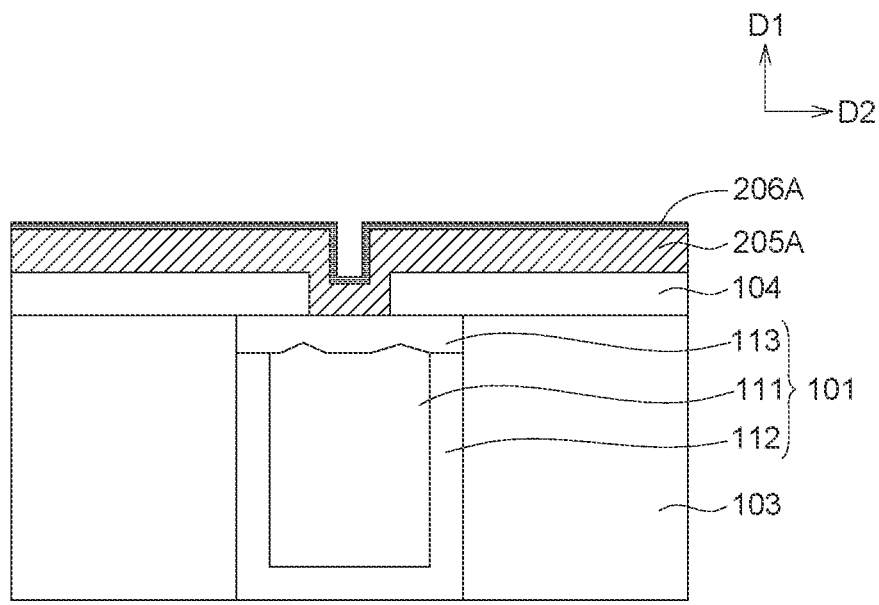

Referring to FIG. 12. An etching inhibition film 206A is formed on the isolation material film 205A. For example, the etching inhibition film 206A may be formed by a deposition process such as a chemical vapor deposition process. The etching inhibition film 206A may include titanium nitride (TiN), tantalum nitride (TaN), titanium (Ti), tantalum (Ta), silicon (Si), silicon nitride (SiN), silicon dioxide (SiO$_2$), aluminum nitride (AlN), etc. The etching inhibition film 206A and the isolation material film 205A may include different materials. The etching inhibition film 206A may have a thickness between 10 Angstroms (Å) and 100 Angstroms (Å) in the longitudinal direction D1. For example, the thickness of the etching inhibition film 206A in the longitudinal direction D1 may be about 25 Angstroms (Å).

Figure 13:
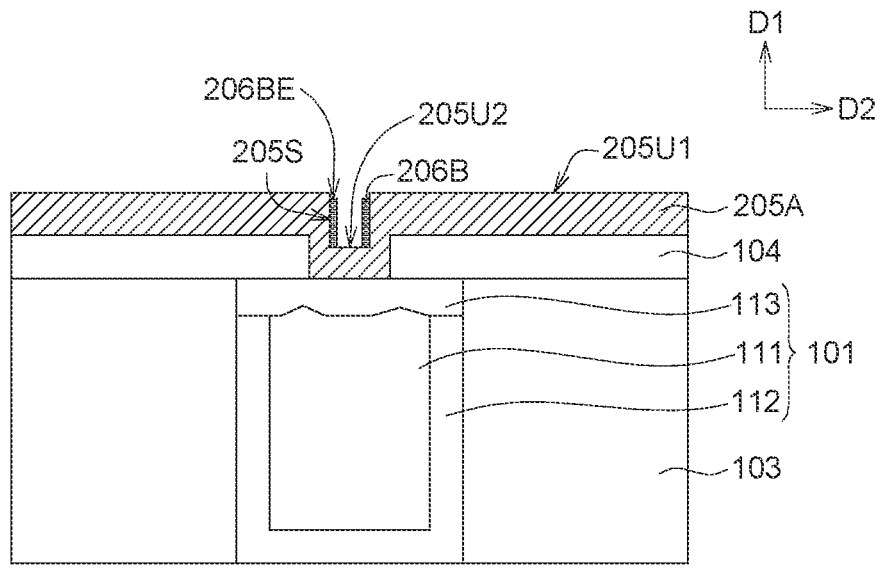

Referring to FIG. 13. A portion of the etching inhibition film 206A is removed to form an etching inhibition film 206B on a sidewall 205S of the isolation material film 205A. In an embodiment, the portions of the etching inhibition film 206A on an upper surfaces 205U1 and 205U2 of the isolation material film 205A may be removed by an etching process such as a wet etching process or a dry etching process, and a portion of the etching inhibition film 206A on the sidewall 205S of the isolation material film 205A is remained to form the etching inhibition film 206B. In an embodiment, the end portion 206BE of the etching inhibition film 206B may be lower than the upper surface 205U1 of the isolation material film 205A in the longitudinal direction D1, which ensures that the portion of the etching inhibition film 206A on the upper surface 205U2 of the isolation material film 205A is removed and is helpful for the subsequent steps.

Figure 14:
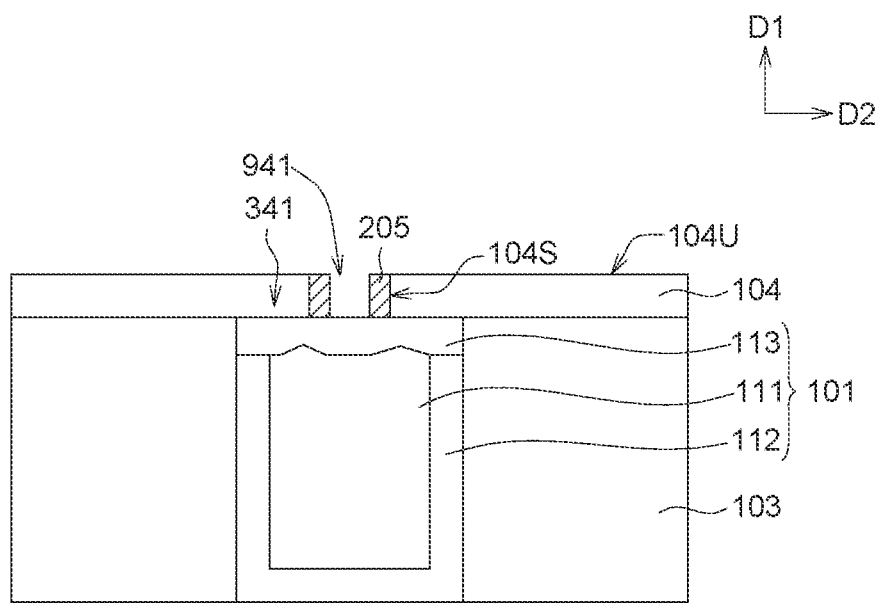

Referring to FIG. 14. A portion of the isolation material film 205A is removed to form an isolation film 205 on a sidewall 104S of the dielectric film 104 and a hole 941 in the isolation film 205. The portion of the isolation material film 205A remained in this step is the isolation film 205. The bottom of the hole 941 exposes the conductive layer 113. The hole 941 may be smaller than the opening 341. The isolation film 205 may include a dielectric material such silicon dioxide ($SiO_2$), silicon nitride (SiN), silicon oxynitride (SiON), aluminum oxide ($Al_2O_3$), etc. In an embodiment, the etching inhibition film 206B, a portion of the isolation material film 205A on the upper surface 104U of the dielectric film 104, and a portion of the isolation material film 205A below the etching inhibition film 206B are removed to expose the conductive layer 113 and the dielectric film 104.

Figure 14A:
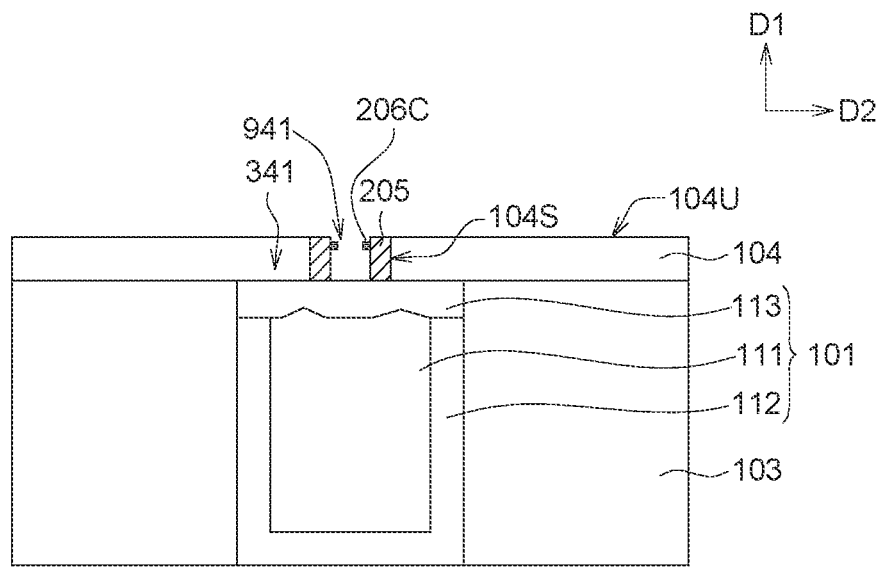

In another embodiment, in the step of formation of the isolation film 205, the etching inhibition film 206B may not be completely removed. For example, a portion of the etching inhibition film 206B, a portion of the isolation material film 205A on the upper surface 104U of the dielectric film 104, and a portion of the isolation material film 205A below the etching inhibition film 206B are removed to expose the conductive layer 113 and the dielectric film 104. The etching inhibition film 206B remained in this step is the etching inhibition film 206C, as shown in FIG. 14A. The etching inhibition film 206C is on the sidewall of the isolation film 205.

Figure 15:
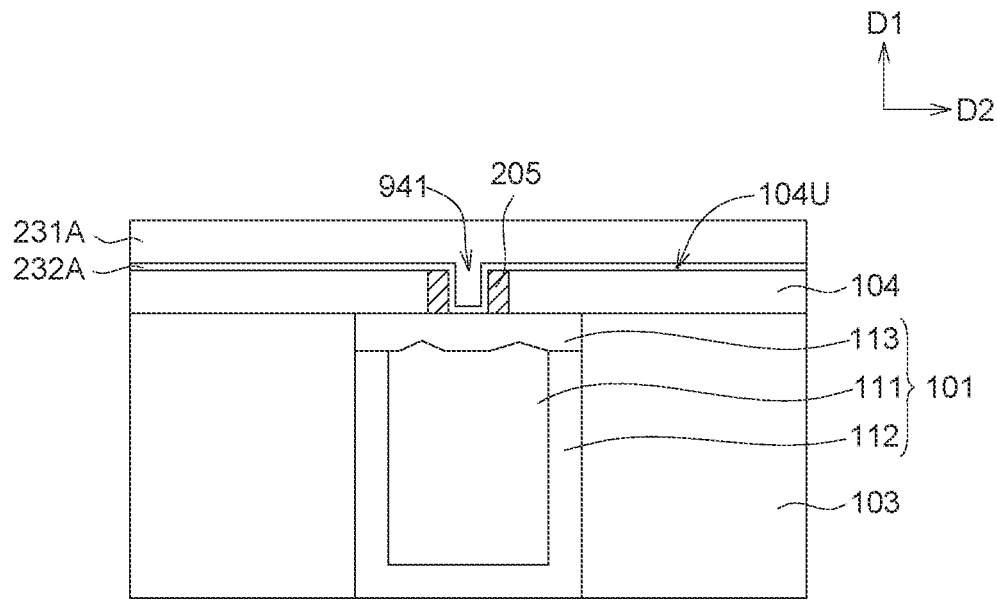
Figure 16:
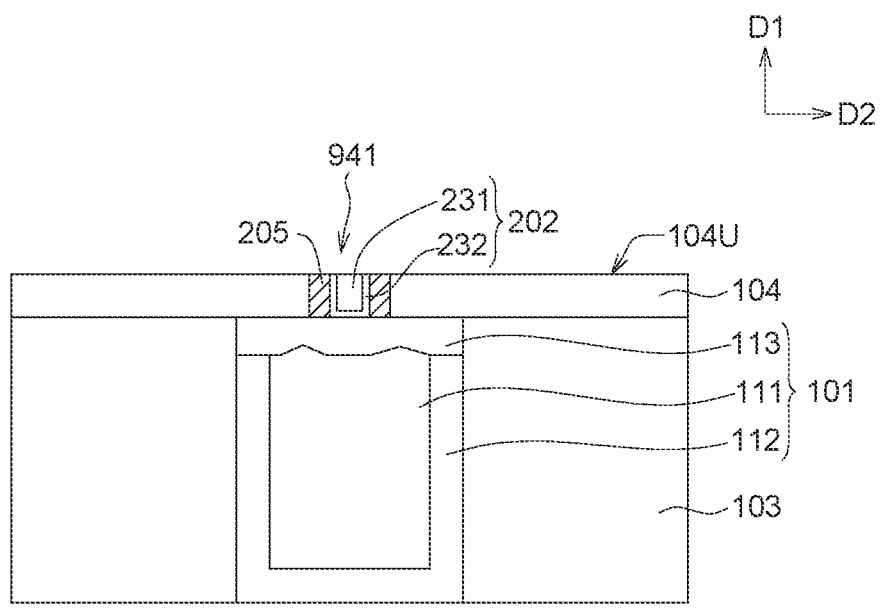

Referring to FIGS. 15-16. After the step shown in FIG. 14, a barrier film 232A is formed on the dielectric film 104 and in the hole 941. A via material film 231A is formed on the barrier film 232A and in the hole 941. Portions of the barrier film 232A and the via material film 231A on the upper surface 104U of the dielectric film 104 are removed and portions of the barrier film 232A and the via material film 231A in the hole 941 are remained to form a barrier film 232 and a conductive via 231 shown in FIG. 16. By which, the via 202 is formed. The portion of the via material film 231A in the hole 941 is the conductive via 231. The via material film 231A and the conductive via 231 may include conductive materials such as titanium nitride (TiN), titanium (Ti), tantalum (Ta), tantalum nitride (TaN), tungsten (W), silicon (Si), Copper (Cu), Hafnium (Hf), etc. The barrier film 232A and the barrier film 232 may include metal barrier materials such as titanium nitride (TiN), tantalum (Ta), cobalt (Co), titanium (Ti), tantalum nitride (TaN), silicon (Si), manganese (Mn), hafnium (Hf), etc. In an embodiment, the barrier film 232A may be formed on the upper surface 104U of the dielectric film 104 and lining the hole 941 by a deposition process such as a chemical vapor deposition process. The via material film 231A may fill the remaining space of the hole 941 and be disposed on the barrier film 232A by a deposition process such as a chemical vapor deposition process. Portions of the barrier film 232A and the via material film 231A on the upper surface 104U of the dielectric film 104 may be removed to form the via 202 by a chemical-mechanical planarization process or other suitable etching processes.

In an embodiment, a semiconductor element 20 shown in FIG. 2 may be provided through the method schematically illustrated in FIGS. 11-16.

In a comparative example, a plug of a semiconductor element does not include a conductive layer on the tungsten plug, and the via directly lands on the tungsten plug. Since the surface of the tungsten plug is usually rough and it is difficult to reduce the roughness of the surface of the tungsten plug, the structure of the comparative example may cause the problems of profile defect of the tungsten plug and improper landing of the via on the tungsten plug. As such, the electrical performance of the semiconductor element is poor. For example, the via and the tungsten plug are electrically insulated from each other, resulting in open circuit problems. For example, at least part of the tungsten plug is not covered by the dielectric film, resulting in open circuit problems.

According to embodiments of the present disclosure, the plug of the semiconductor element includes a conductive layer between the tungsten plug and the via, and the via can land on the conductive layer. With such a configuration, the problem of poor electrical performance of the device resulting from the profile defect of the tungsten plug can be avoided, and a proper landing of the via on the plug can be ensured. The plug of the present disclosure has a desired profile. A good electrical connection between the plug and the via can be achieved. Yield and electrical performance of the semiconductor elements can be improved significantly.

It is noted that the elements and methods as described above are provided for illustration. The disclosure is not limited to the configurations and procedures disclosed above. Other embodiments with different configurations of known elements can be applicable, and the exemplified elements could be adjusted and changed based on the actual needs of the practical applications. It is, of course, noted that the configurations of figures are depicted only for demonstration, not for limitation. Thus, it is known by people skilled in the art that the related elements and layers in a semiconductor element, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor element, comprising:
   a plug comprising a tungsten plug and a conductive layer on the tungsten plug, wherein the tungsten plug and the conductive layer comprise different materials, the tungsten plug has a first width in a lateral direction, the conductive layer has a second width in the lateral direction, the second width is greater than or equal to the first width;
   a via on the plug and electrically connected to the plug, wherein the conductive layer is between the via and the tungsten plug, the via comprises a conductive via and a barrier film on a sidewall of the conductive via, part of the barrier film is between the conductive via and the conductive layer; and
   a dielectric layer, wherein the tungsten plug and the conductive layer are in the dielectric layer.

2. The semiconductor element according to claim 1, wherein the plug has a third width in the lateral direction, the via has a via width in the lateral direction, the third width is greater than two times of the via width.

3. The semiconductor element according to claim 2, wherein the third width is between 100 nm and 500 nm, the via width is between 50 nm and 250 nm.

4. The semiconductor element according to claim 1, wherein the plug has a third width in the lateral direction, the via has a via width in the lateral direction, the third width is greater than three times of the via width.

5. The semiconductor element according to claim 4, wherein the third width is between 100 nm and 500 nm, the via width is between 5 nm and 90 nm.

6. The semiconductor element according to claim 1, wherein the via is electrically connected to the conductive layer and the tungsten plug.

7. The semiconductor element according to claim 1, wherein the plug comprises a barrier layer on a sidewall of the tungsten plug, the barrier layer and the tungsten plug directly contact the conductive layer.

8. The semiconductor element according to claim 1, wherein the tungsten plug and the conductive layer are within an opening penetrating the dielectric layer along a direction, and the conductive layer is above the tungsten plug in the direction.

9. The semiconductor element according to claim 1, wherein the barrier film directly contacts the conductive layer.

10. The semiconductor element according to claim 1, wherein an upper surface of the conductive layer is lower than an upper surface of the dielectric layer.

11. The semiconductor element according to claim 1, wherein an upper surface of the conductive layer is higher than an upper surface of the dielectric layer.

12. The semiconductor element according to claim 1, further comprising a dielectric film and an isolation film, the via is in the dielectric film, the isolation film is between the dielectric film and the via.

13. The semiconductor element according to claim 12, wherein the barrier film directly contacts the conductive layer and the isolation film.

14. The semiconductor element according to claim 1, wherein a roughness of an upper surface of the conductive layer is less than a roughness of an upper surface of the tungsten plug.

15. A method for manufacturing a semiconductor element, comprising:
    forming an opening in a dielectric layer;
    forming a tungsten plug in the opening;
    forming a conductive layer above the tungsten plug, wherein the conductive layer and the tungsten plug are in the opening and in the dielectric layer; and
    forming a via on the conductive layer, wherein the via is electrically connected to the conductive layer and the tungsten plug, the tungsten plug and the conductive layer comprises different materials, the via comprises a conductive via and a barrier film on a sidewall of the conductive via, part of the barrier film is between the conductive via and the conductive layer.

16. The method according to claim 15, further comprising:
    forming a dielectric film on the conductive layer;
    forming a hole in the dielectric film, wherein the hole is smaller than the opening, the hole exposes the conductive layer; and
    forming the via in the hole.

17. The method according to claim 15, further comprising:
    forming a dielectric film on the conductive layer;
    forming an isolation film on a sidewall of the dielectric film, wherein the isolation film is between the via and the dielectric film.

18. The method according to claim 17, further comprising:
    forming a hole in the isolation film, wherein the hole is smaller than the opening and exposing the conductive layer.

19. The method according to claim 15, further comprising:
    forming an isolation material film on the conductive layer;
    forming an etching inhibition film on the isolation material film, wherein the etching inhibition film and the isolation material film comprises different materials; and
    removing a portion of the etching inhibition film and a portion of the isolation material film to expose the conductive layer.

20. The method according to claim 15, wherein the tungsten plug has a first width in a lateral direction, the conductive layer has a second width in the lateral direction, the second width is greater than or equal to the first width.

* * * * *